(12) United States Patent
Kwok

(10) Patent No.: US 9,026,888 B2
(45) Date of Patent: May 5, 2015

(54) METHOD, SYSTEM AND APPARATUS FOR PROVIDING ACCESS TO ERROR CORRECTION INFORMATION

(71) Applicant: Intel Corporation, Santa Clara, CA (US)

(72) Inventor: Zion S. Kwok, Victoria (CA)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 13/725,809

(22) Filed: Dec. 21, 2012

(65) Prior Publication Data

US 2014/0181615 A1 Jun. 26, 2014

(51) Int. Cl.
| | |
|---|---|
| *G11C 29/00* | (2006.01) |
| *H03M 13/29* | (2006.01) |
| *G06F 11/00* | (2006.01) |
| *H03M 13/09* | (2006.01) |
| *H03M 13/11* | (2006.01) |
| *H03M 13/15* | (2006.01) |
| *H03M 13/19* | (2006.01) |

(52) U.S. Cl.
CPC .......... *H03M 13/2906* (2013.01); *G06F 11/00* (2013.01); *H03M 13/095* (2013.01); *H03M 13/1102* (2013.01); *H03M 13/1515* (2013.01); *H03M 13/152* (2013.01); *H03M 13/19* (2013.01)

(58) Field of Classification Search
CPC ........... H03M 13/2906; G06F 11/1048; G11B 20/1803; G11B 20/1833; G11B 2220/2516; G11B 2020/1265
See application file for complete search history.

(56) References Cited

U.S. PATENT DOCUMENTS

| | | | | |
|---|---|---|---|---|
| 7,131,050 | B2 * | 10/2006 | Holt | 714/763 |
| 8,495,454 | B2 * | 7/2013 | Yang | 714/755 |
| 2003/0163777 | A1 * | 8/2003 | Holt | 714/763 |
| 2010/0011275 | A1 * | 1/2010 | Yang | 714/755 |
| 2011/0231739 | A1 * | 9/2011 | Kim | 714/773 |
| 2011/0296258 | A1 * | 12/2011 | Schechter et al. | 714/704 |
| 2012/0166984 | A1 * | 6/2012 | Brunswig et al. | 715/765 |
| 2012/0278687 | A1 * | 11/2012 | Sharon et al. | 714/790 |
| 2013/0046993 | A1 * | 2/2013 | Jueneman et al. | 713/186 |
| 2013/0271655 | A1 * | 10/2013 | Krahnstoever et al. | 348/500 |

* cited by examiner

*Primary Examiner* — Guerrier Merant
(74) *Attorney, Agent, or Firm* — Blakely, Sokoloff, Taylor & Zafman LLP

(57) ABSTRACT

Techniques and mechanisms to facilitate data error detection by a memory controller. In an embodiment, the memory controller calculates, for each of a plurality of data blocks, a respective result based on a first metadata value and data of that data block, where the first metadata value describes a characteristic which is common to each of the plurality of data blocks. With each such calculated result, the memory controller further performs a respective error detection analysis, wherein such analysis is based on a retrieved error correction code for a corresponding one of the plurality of data blocks. In another embodiment, a single version of the metadata value is stored by the memory controller, where the single version of the metadata value is made available to facilitate error detection for any of the plurality of data blocks.

18 Claims, 9 Drawing Sheets

METHOD, SYSTEM AND APPARATUS FOR PROVIDING ACCESS TO ERROR CORRECTION INFORMATION

BACKGROUND

1. Technical Field

The present invention relates generally to the field of computer memory systems and, more particularly but not exclusively, to detection and correction of data errors.

2. Background Art

Soft errors in data storage elements, such as cells of a memory device, occur when incident radiation charges or discharges the storage element, thereby changing its binary state. Soft errors are increasingly a concern with smaller scale fabrication processes as the size (hence, the capacitance) of the storage elements shrink, since incident radiation will have greater effect in causing the soft errors on such smaller scale storage elements. Previously, soft errors were statistically significant only for large and dense storage structures, such as cache memories. However, the smaller feature structures of next-generation memory devices are now more prone to having soft errors.

A problem with soft errors is that they have a tendency to silently corrupt data. This type of silent data corruption (SDC) is not desirable, particularly in a hard drive and/or a solid-state drive (SSD) of a computer system. Conventional error mitigation techniques variously provide for the storage of error correction codes along with the respective data to which such error correction codes each correspond. As computer system technologies increasingly rely on efficient utilization of memory storage capacity, the burdens imposed by having to support error detection and correction will be increasingly significant in terms of their affect on memory device performance.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide mechanisms and/or techniques to implement data error detection and, in an embodiment, data error correction. Certain embodiments provide improvements in memory utilization for facilitating such error detection/correction.

By way of illustration and not limitation, a memory controller may receive one or more write requests to store a plurality of data blocks each to a respective memory location of one or more memory devices. In an embodiment, a first metadata value describes a characteristic which is common to all of the plurality of data blocks. For each of the plurality of data blocks, the memory controller may calculate a respective result which is based on that data block and the first metadata value common to all of the plurality of data blocks. Moreover, with each of the respective results, the memory controller may further perform respective error detection operations.

In an embodiment, servicing of the one or more write requests includes the memory controller storing to the one or more memory devices the plurality of data blocks and the calculated error correction codes. The memory controller may further store a single version of the metadata value—e.g. to a memory location which stored one of the data blocks or to some other memory location. Reference information may indicate that the stored single version of the metadata value is available for error detection (and, in an embodiment, error correction) for any of the plurality of data blocks.

Additionally or alternatively, the memory controller may receive one or more read requests to access the plurality of data blocks stored in the one or more memory devices. Based on the reference information, the memory controller may access the same stored version of the metadata value to perform error detection for some or all of the plurality of data blocks. Storage of only a single version of such a metadata value provides for efficient memory utilization in supporting error detection and/or error correction functionality.

Figure 1:
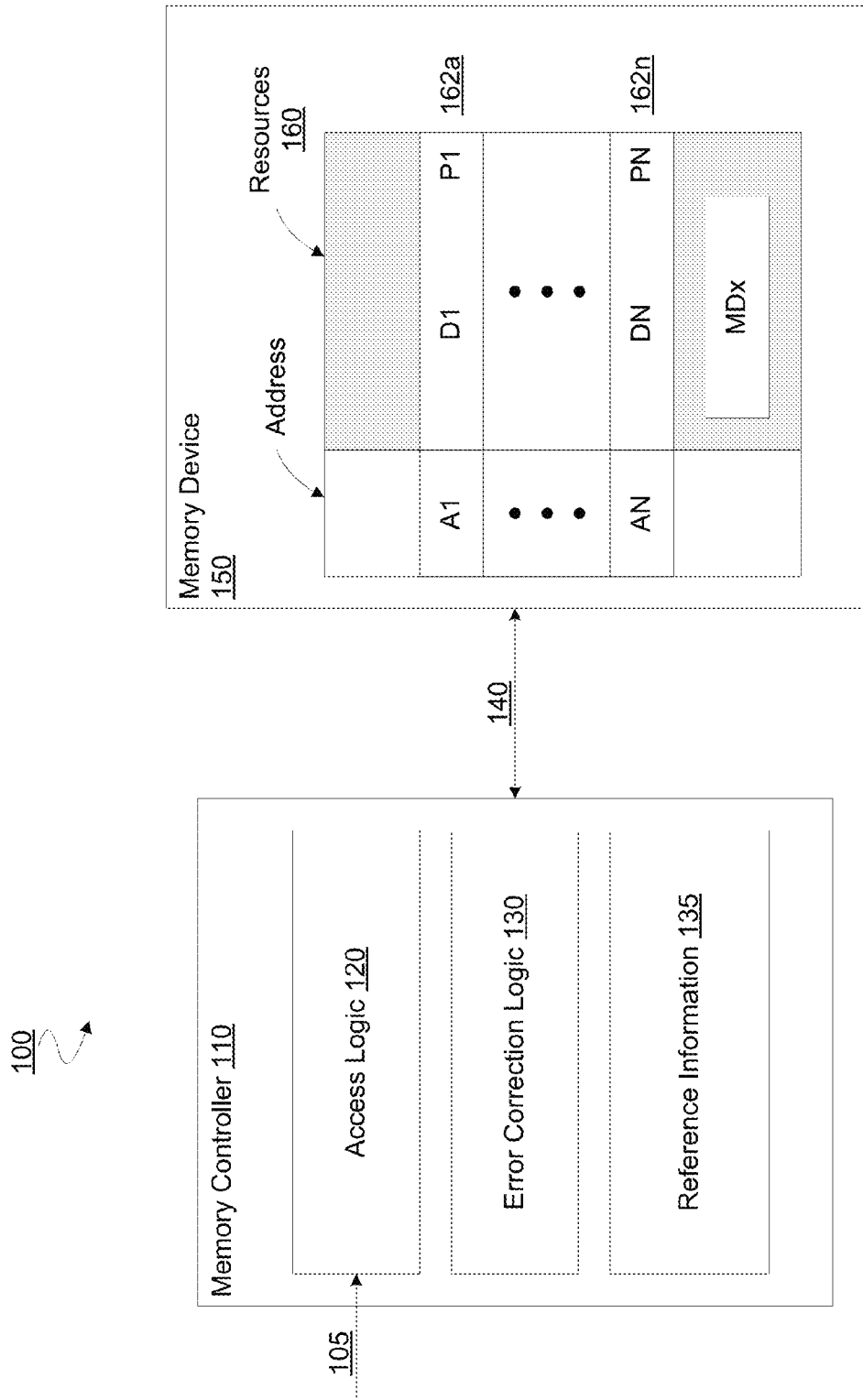
FIG. 1 is a block diagram illustrating elements of a memory system for providing error correction information according to an embodiment.

FIG. 1 shows elements of an illustrative computer system 100 for providing error correction information according to an embodiment. Computer system 100 may, for example, include a hardware platform of a personal computer such as a desktop computer, laptop computer, a handheld computer—e.g. a tablet, palmtop, cell phone, media player, and/or the like—or other such computer system. Alternatively or in addition, computer system 100 may provide for operation as a server, workstation, or other such computer system. In an embodiment, computer system 100 includes logic to access an error correction code for a value which is calculated based on data stored in a memory location and a metadata value describing such data.

Computer system 100 may include one or more memory devices (represented by an illustrative memory device 150) to store data and memory controller 110 for controlling access to the one or more memory devices. Certain embodiments are discussed herein with respect to a memory controller controlling a single memory device. However, such discussion may be extended to additionally or alternatively apply, according to various embodiments, to a memory controller variously controlling a plurality of memory devices.

In an embodiment, memory controller 110 is coupled to memory device 150 via one or more signal lines 140. One or more signal lines 140 may include one or more of a data bus, control bus, address bus, clock signal line, power supply line and/or the like. In an embodiment, memory device 150 comprises random access memory (RAM) including, but not limited to, one or more of dynamic RAM (DRAM), static RAM (SRAM), synchronous DRAM (SDRAM), double data rate (DDR) SDRAM (DDR-SDRAM), Rambus DRAM (RDRAM), flash memory, non-volatile static RAM (nvS-RAM), ferroelectric RAM (FRAM), magnetoresistive RAM (MRAM), phase-change memory (PCM), three dimensional cross-point memory or any of a variety of other memory hardware. Memory device 150 may include a solid state drive (SSD) and/or a hard disk drive (HDD) of computer system 100, although certain embodiments are not limited in this regard. Operations of memory controller 110 to access memory device 150 may be in addition to those to access one or more other memory devices (not shown) of computer system 100.

In an embodiment, resources 160 of memory device 150 include memory locations 162a, ..., 162n which are each addressable by a different respective address. By way of illustration and not limitation, memory locations 162a, ..., 162n may be variously addressable by physical addresses A1, ..., AN, respectively. In an alternate embodiment, memory locations 162a, ..., 162n are distributed across a plurality of memory devices (not shown) which are each controlled by memory controller 110.

In an illustrative scenario according to one embodiment, memory locations 162a, ..., 162n variously store respective data blocks—e.g. D1, ..., DN—during operation of system 100. Memory device 150 (and, in embodiment, memory controller 110) may access data block D1 of memory location 162a, for example, by referencing physical address A1. Additionally or alternatively, memory controller 110 may access memory location 162a by referencing a logical address corresponding to physical address A1. Any of a variety of conventional addressing schemes may be adapted for memory controller 110 and/or memory device 150 to reference locations of resources 160 each with a respective location-specific address, according to different embodiments.

Memory device 110 may further store error correction codes which are each associated with a respective data block stored in resources 160. By way of illustration and not limitation, error correction codes P1, ..., PN may be associated with data blocks D1, ..., DN, respectively—e.g. where some or all of locations 162a, ..., 162n each further store a respective one of P1, ..., PN. In an alternate embodiment, some or all of error correction codes P1, ..., PN are variously stored in other locations in resources 160 and/or memory device 150. In an alternate embodiment, some or all of error correction codes P1, ..., PN are distributed across a plurality of memory devices controlled by memory controller 110.

In an embodiment, system 100 stores one or more metadata values which each describe a respective characteristic, where at least one such metadata value is applicable to—or "common to"—each of multiple data blocks stored in memory device 150. By way of illustration and not limitation, resources 160 may include a metadata value MDx which is descriptive of both data block D1 and data block DN. MDx may describe any of a variety of additional or alternative data blocks, according to different embodiments. Any of a variety of characteristics applicable to multiple data blocks may be indicated by MDx, according to various embodiments. By way of illustration and not limitation, MDx may include a statistic—such as a write count, a read count, etc.—describing accesses to the data blocks. Alternatively, MDx may include a file name, index or other identifier of a logical grouping to which the data blocks belong. In another embodiment, MDx includes a tag, such as a "poison" value which indicates whether the data blocks are to be ignored. Alternatively, MDx may include a timestamp for some previous or future processing of the data blocks. In still another embodiment, MDx includes cryptography information, such as an encryption key, or other security information relevant to protecting each such data block. Alternatively or in addition, MDx is a concatenation, addition or other combination which includes one or more such metadata values. In one embodiment, MDx is, or includes, a metadata value (e.g. a scrambling key, a host address, an indirection address, a validity identifier, etc.) other than a parity value or other error correction code. Certain embodiments are not limited with respect to the particular type of metadata characteristic represented by metadata value MDx. One of locations 162a, ..., 162n may store the version of MDx shown in resources 160, although certain embodiments are not limited in this regard.

In an embodiment, two or more of error correction codes P1, ..., PN are variously calculated based on metadata value MDx. Calculation of such two or more error correction codes may each be further based on the respective data blocks to which they correspond. By way of illustration and not limitation, P1 may be a parity value or other correction code for a value which is a result of a calculation for which D1 and MDx are operands. Similarly, PN may be a parity value or other correction code for a value which is a result of a calculation for which DN and MDx are operands.

Memory controller 110 may include circuit logic for implementing any of a variety of conventional techniques for controlling access to memory device 150. By way of illustration and not limitation, memory controller 110 may comprise logic for processing one or more requests 105 received by memory controller 110. One or more requests 105 may include a read request to retrieve stored data from resources 160 and/or a write request to store data to resources 160—e.g. where memory controller 110 receives one or more requests 105 from a host (e.g. including one or more processor cores, not shown) of computer system 100. Such logic of memory controller 110 may convert one or more requests 105 each into a corresponding set of signals to send to memory device 150 via one or more signal lines 140. Such logic may, for example, perform any of a variety of operations to provide address translation, data refreshes etc. to order, synchronize or otherwise regulate exchanges via one or more signal lines 140 for accessing resources 160.

Memory controller 110 may supplement conventional controller functionality with circuit logic to evaluate—e.g. calculate or otherwise process—an error correction code based on a combination of data stored in (or to be stored in) a memory location and metadata associated with that data. By way of illustration and not limitation, memory controller 110 may include access logic 120 to receive one or more requests 105—e.g. from a central processing unit (CPU), graphics processor, co-processor or other host agent (not shown) of computer system 100.

Access logic 120 may, for example, service one or more read requests to access data stored in resources 160. In an embodiment, some or all read requests each include an address identifier specifying a respective address—e.g. including a physical address and/or a logical address—for a location in resources 160. In an embodiment, access logic 120 operates with error correction logic 130 of memory controller 110 to determine whether data retrieved from an addressed location has a data error (or errors). For example, servicing one or more read requests may include access logic 120 retrieving some or all data of a first data block, some or all data of a second data block, and error correction codes each corresponding to a respective one of the first data block and the second data block. Error correction logic 130 may receive the retrieved data and error correction codes. In an embodiment, error correction logic 130 may further be provided with, or otherwise access, a metadata value, such as MDx, which describes a characteristic common to the first data block and the second data block. For example, correction logic 130 may be provided with MDx based on access logic 120 accessing reference information 135, which directly or indirectly indicates an association of MDx with both the first data block and the second data block. Error correction logic 130 may perform an evaluation, based on the metadata value, of whether the retrieved data of the first data block and/or the retrieved data of the second data block includes a data error.

Additionally or alternatively, access logic 120 may service one or more write requests by writing data blocks each to a respective addressable location of resources 160. Access logic 120 may operate with error correction logic 130 to include in the servicing of one or more write requests a writing of error correction information to be available for later access and evaluation. For example, one or more requests 105 may include a first data block and a second data block each to be written to a respective location of resources 160. Servicing one or more write requests may include access logic 120 providing to error correction logic 130 some or all data of the first data block and the second data block.

In an embodiment, error correction logic 130 identifies a metadata value as corresponding to both the first data block and the second data block. For example, error correction logic 130 may detect that two write requests each include the same metadata value, or otherwise identify that a single characteristic, represented by a metadata value, is descriptive of two or more data blocks and/or the communication or other processing of two or more associated write requests.

Error correction logic 130 may include circuit logic to perform, according to techniques discussed herein, calculations each for generating an error correction code associated with a respective data block. In an embodiment, each such calculation has as an input the same metadata value which is common to the data blocks. In an embodiment, a single copy of the metadata value is stored to be made available for future error detection (and in an embodiment, error correction) of either the first data block or the second data block.

Figure 2A:
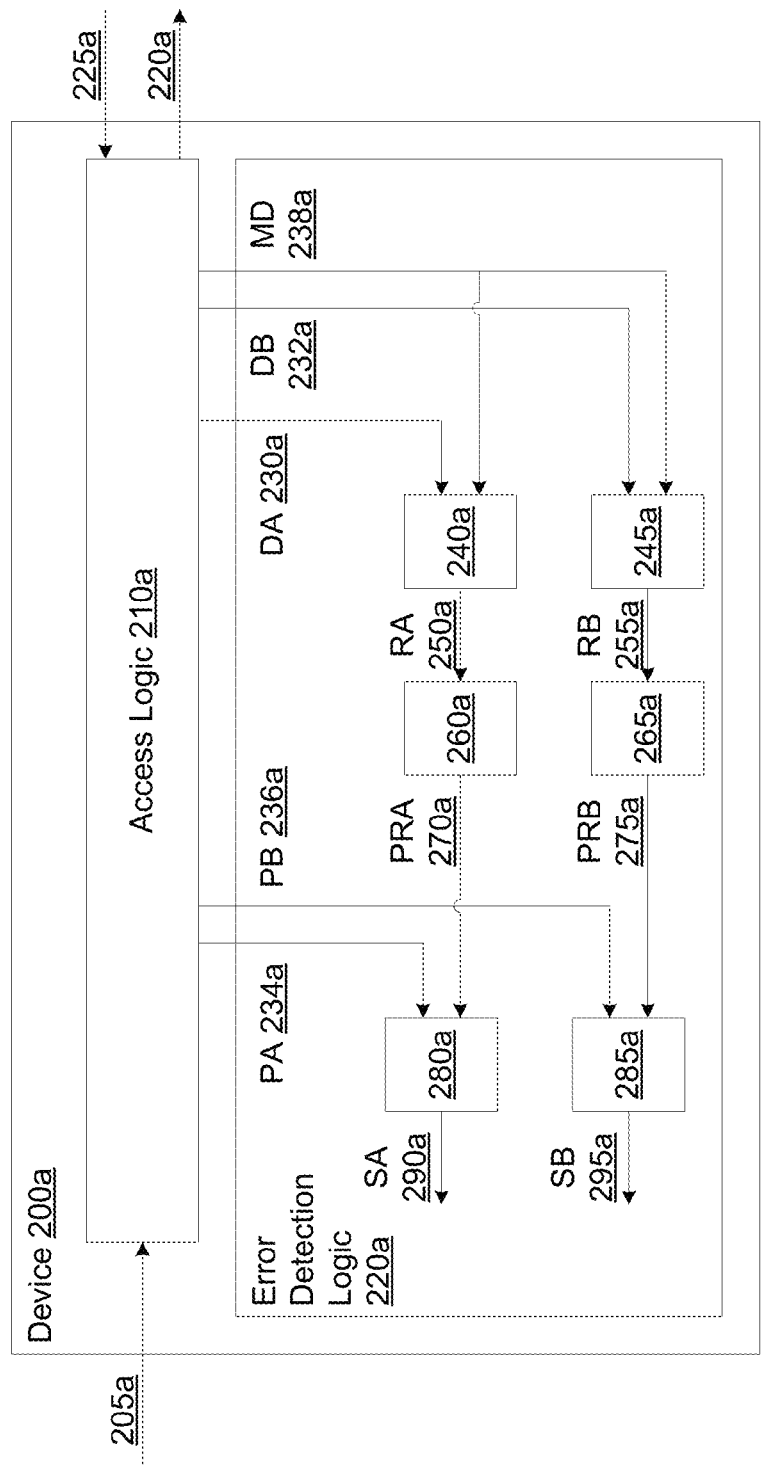
FIGS. 2A and 2B are block diagrams each illustrating elements of a respective memory controller for reading error correction information according to a respective embodiment.
Figure 2B:
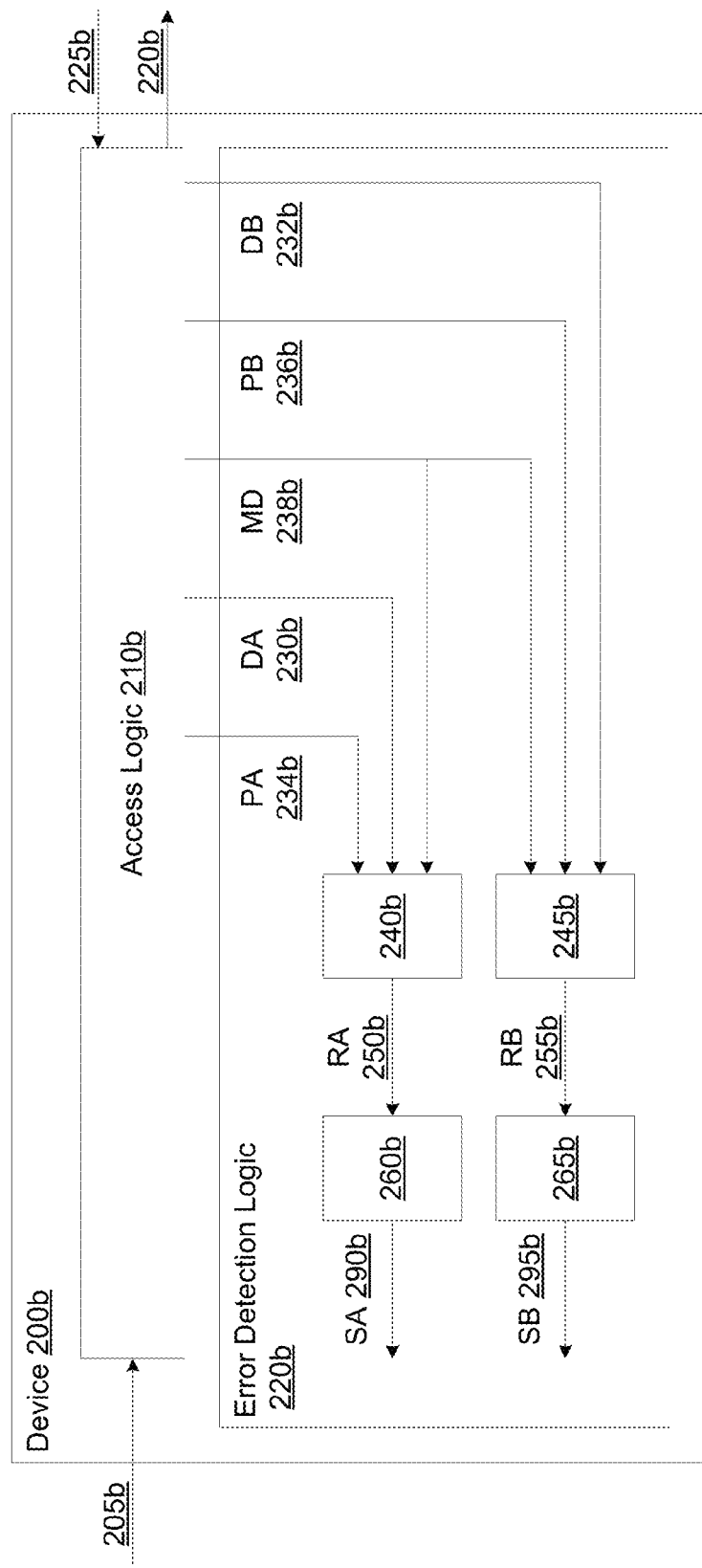

FIGS. 2A and 2B illustrate elements of respective memory controllers 200a, 200b each for variously performing error detection according to respective embodiments. Memory controllers 200a, 200b represent two examples of logic to variously service one or more read requests—e.g. including the memory controller retrieving from one or more memory devices first data of a first data block, second data of a second data block, a first error correction code corresponding to the first data block and a second error correction code corresponding to the second data block. For example, memory controllers 200a, 200b variously provide logic to generate a first result based on the retrieved first data and a first metadata value stored at a first location—e.g. wherein the first metadata value describes a characteristic common to the first data and the second data—and to perform a first error detection analysis with the first result, wherein the first error detection analysis is based on the retrieved first error correction code. Similarly, memory controllers 200a, 200b variously provide logic to generate a second result, based on the retrieved second data and the first metadata value stored at the first location, and to perform a second error detection analysis with the second result, wherein the second error detection analysis is based on the retrieved second error correction code.

FIG. 2A illustrates elements of a device 200a for providing access to error correction information according to an embodiment. Device 200a may include some or all of the features of memory controller 110, for example. In an embodiment, device 200a operates to access one or more locations of a memory such as memory device 150.

Device 200a may comprise access logic 210a—e.g. including hardware, firmware and/or executing software—to service one or more read requests 205a. One or more read requests 205a may be received by device 200a from a host of a computer system which includes device 200a—e.g. where device 200a controls access by the host to an array of memory locations (not shown) of the computer system. Access logic 210a may include some or all of the features of access logic 120, for example.

Servicing one or more read requests 205a may include access logic 210a retrieving data blocks DA 230a, DB 232a and error correction codes PA 234a, PB 236a corresponding to DA 230a and DB 232a, respectively. For example, access logic 210a may send to the memory device read commands 220a based on address information in one or more read requests 205a, where the memory provides a response 225a to read commands 220a which includes data blocks DA 230a, DB 232a and error correction codes PA 234a, PB 236a. One or each of error correction codes PA 234a, PB 236a may, for example, represent a low-density parity-check (LDPC) code for a respective value which is based on a data block and a metadata value corresponding to the data block. Alternatively or in addition, one or each of error correction codes PA 234a, PB 236a may include a respective Hamming code, a Reed-Solomon code a Bose, Ray-Chaudhuri, Hocquenghem (BCH) code and/or any of a variety of additional or alternative error correction codes for such a value.

In an embodiment, response 225a further provides a metadata value MD 238a which describes a characteristic common to both DA 230a and DB 232a. Alternatively, MD 238a may be retrieved from another location in response to one or more read requests 205a. In an embodiment, the same copy of MD 238a is accessed—e.g. from the same location of a memory resource—for both error detection of DA 230a and error detection of DB 232a.

Device 200a may further comprise error detection logic 220a to receive MD 238a, and data blocks DA 230a, DB 232a and error correction codes PA 234a, PB 236a from response 225a. Error detection logic 220a may include some or all of the features of error correction logic 130, for example. In an embodiment, MD 238a and DA 230a may be provided as inputs to process circuitry 240a of error detection logic 230a, where a result RA 250a output from process circuitry 240a is a value based on both MD 238a and DA 230a. By way of illustration and not limitation RA 250a may be an encoding of MD 238a and DA 230a. Such encoding may include one or more arithmetic operations—e.g. including a concatenation operation, an addition operation, a shift operation and/or the like—for which MD 238a and DA 230a are operands. Alternatively or in addition, MD 238a and DB 232a may be provided as inputs to process circuitry 245a of error detection logic 230a, where a result RB 255a output from process circuitry 245a is a value based on both MD 238a and DB 232a. Calculations for process circuitry 245a to generate RB 255a may be similar to those of process circuitry 240a to generate RA 250a. In an embodiment, process circuitry 240a, 245a are the same circuitry.

With the calculated results RA 250a, RB 255a, error detection logic 220a may perform an evaluation with error correction codes PA 234a, PB 236a to determine whether one or both of DA 230a, DB 232a includes an error. By way of illustration and not limitation, process circuitry 260a of error detection logic 220a may calculate a value PRA 270a which includes a LDPC code value, Hamming code, a Reed-Solomon code, a BCH code or other such error correction code value for RA 250a. Alternatively or in addition, process circuitry 265a of error detection logic 220a may calculate a value PRB 275a which includes a LDPC code value, Hamming code, a Reed-Solomon code, a BCH code or other such error correction code value for RB 255a. Process circuitry 260a, 265a may be the same circuitry, although certain embodiments are not limited in this regard. In an embodiment, error detection logic 220a may similarly perform an evaluation with error correction codes PA 234a, PB 236a to additionally or alternatively determine whether MD 238a includes an error.

In an embodiment, process circuitry 280a of error detection logic 220a may evaluate PA 234a based on PRA 270a—e.g. including process circuitry 280a comparing PRA 270a to PA 234a. For example, a difference between PRA 270a and PA 234a may indicate an error in DA 230a. Based on the evaluation of PA 234a, process circuitry 280a may generate a signal 290a indicating whether DA 230a includes such a data error. Alternatively or in addition, process circuitry 285a of error detection logic 220a may evaluate PB 236a based on PRB 275a—e.g. including process circuitry 285a comparing PRB 275a to PB 236a. A difference between PRB 275a and PB 236a may indicate an error in DB 232a. Based on the evaluation of PB 236a, process circuitry 285a may generate a signal 295a indicating whether DB 232a includes such a data error. In an embodiment, process circuitry 280a, 285a are the same circuitry. Error correction may be performed in response to one or both of signals 290a, 295a—e.g. according to any of a variety of conventional error correction techniques.

FIG. 2B illustrates elements of a device 200b for providing access to error correction information according to an embodiment. Device 200b may include some or all of the features of memory controller 110, for example. In an embodiment, device 200b operates to access one or more locations of a memory such as memory device 150.

Device 200b may comprise access logic 210b—e.g. including hardware, firmware and/or executing software—to service one or more read requests 205b which, for example, include some or all of the features of one or more read requests 205a. Access logic 210b may include some or all of the features of access logic 120, for example. Servicing one or more read requests 205b may include access logic 210b retrieving data blocks DA 230b, DB 232b and error correction codes PA 234b, PB 236b corresponding to DA 230b and DB 232b, respectively. For example, access logic 210b may send to the memory device read commands 220b based on address information in one or more read requests 205b, where the memory provides a response 225b to read commands 220b which includes data blocks DA 230b, DB 232b and error correction codes PA 234b, PB 236b. One or each of PA 234b and PB 236b may include some or all of the features of PA 234a and/or PB 236b, for example. In an embodiment, response 225b further provides a metadata value MD 238b which describes a characteristic common to both DA 230b and DB 232b. Alternatively, MD 238b may be retrieved from another location in response to one or more read requests 205b. In an embodiment, the same copy of MD 238b is accessed—e.g. from the same location of a memory resource—for both error detection of DA 230b and error detection of DB 232b.

Device 200b may further comprise error detection logic 220b to receive MD 238b, and data blocks DA 230b, DB 232b and error correction codes PA 234b, PB 236b from response 225b. Error detection logic 220b may include some or all of the features of error correction logic 130, for example. In an embodiment, PA 234b, MD 238b and DA 230b may be provided as inputs to process circuitry 240b of error detection logic 220b, where a result RA 250b output from process circuitry 240b is a value based on both MD 238b and DA 230b (and in this example, further based on PA 234b). By way of illustration and not limitation RA 250b may be a codeword which concatenates or otherwise includes or is based on each of PA 234b, MD 238b and DA 230b. Alternatively or in addition, PB 236b, MD 238b and DB 232b may be provided as inputs to process circuitry 245b of error detection logic 220b, where a result RB 255b output from process circuitry 245b is a value based on both MD 238b and DB 232b (and in this example, further based on PB 236b). Calculations for process circuitry 245b to generate RB 255b may be similar to those of process circuitry 240b to generate RA 250b. In an embodiment, process circuitry 240b, 245b are the same circuitry.

With the calculated results RA 250b, RB 255b, error detection logic 220b may perform respective error detection analyses each to determine whether an error is indicated by a corresponding one of RA 250b, RB 255b. By way of illustration and not limitation, process circuitry 260b of error detection logic 220b may calculate a syndrome of the codeword of RA 250b and determine whether the syndrome is equal to zero (or some other reference value). A non-zero syndrome value for RA 250b may be indicative of a data error—e.g. in one or more of PA 234b, MD 238b and DA 230b. Any of a variety of conventional syndrome decoding techniques may be adapted to perform the functionality of process circuitry 260b according to various embodiments. Such conventional syndrome decoding techniques are outside of the scope of this disclosure, and are not limiting on certain embodiments. Alternatively or in addition, process circuitry 265b may similarly calculate a syndrome of the codeword of RB 255b and determine whether the syndrome is equal to zero (or some other reference value). Process circuitry 260b, 265b may be the same circuitry, although certain embodiments are not limited in this regard. In an embodiment, one or both of process circuitry 260b, 265b operate to variously detect for errors in some or all of DA 230b, DB 232b, PA 234b, PB 236b and MD 238b.

Based on the syndrome analysis for RA 250b, process circuitry 260b may generate a signal 290b indicating whether DA 230b (and/or one or both of PA 234b, MD 238b) includes a data error. Alternatively or in addition, process circuitry 265b may generate a signal 295b based on the syndrome analysis for RB 2550b to indicate whether DB 232b (and/or one or both of PB 236b, MD 238b) includes a data error. Error correction may be performed in response to one or both of signals 290b, 295b—e.g. according to any of a variety of conventional error correction techniques.

Figure 3:
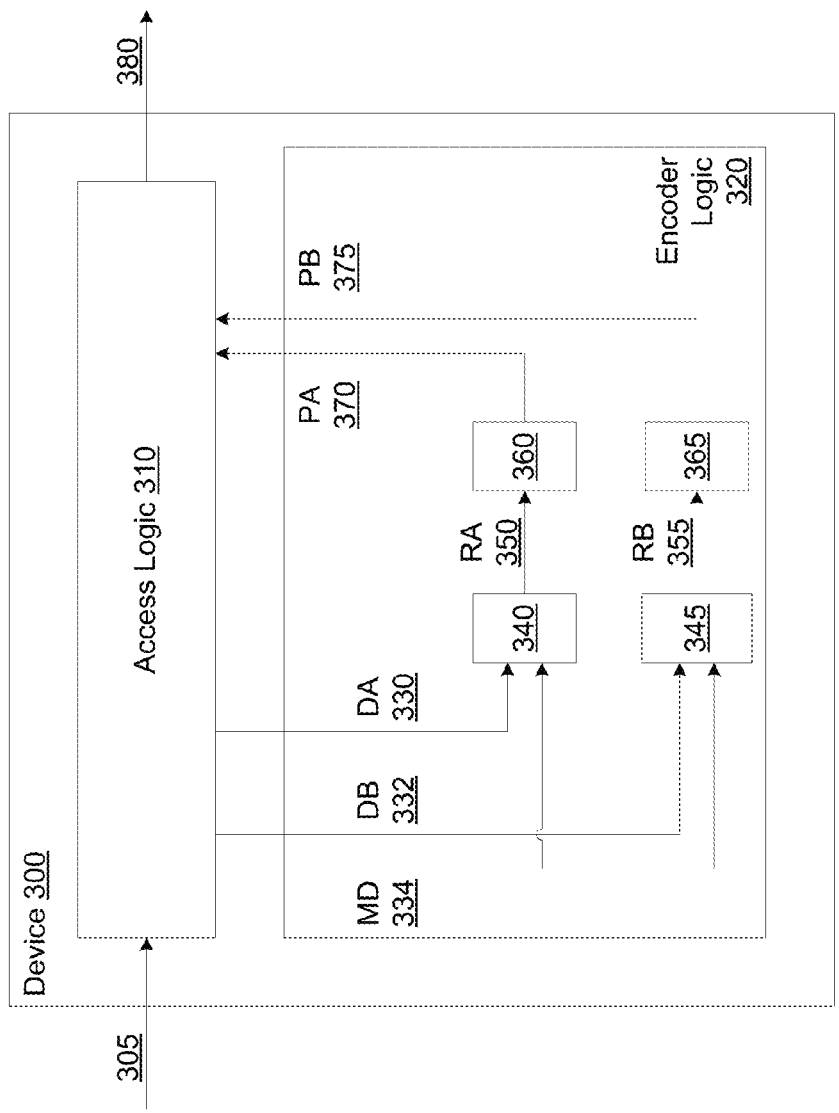
FIG. 3 is a block diagram illustrating elements of a memory controller for writing error correction information according to an embodiment.

FIG. 3 illustrates elements of a device 300 for providing access to error correction information according to an embodiment. Device 300 may include some or all of the features of memory controller 110, for example. In an embodiment, device 300 provides some or all of the functionality of device 200a (and/or of device 200b).

Device 300 may comprise access logic 310 to service write requests 305 received by device 300. Write requests 305 may be received by device 300 from a host of a computer system which includes device 300—e.g. where device 300 controls access by the host to an array of memory locations (not shown) of the computer system. In an embodiment, write requests 305 includes data blocks DA 330 and DB 332, where write requests 305 variously request that DA 330 and DB 332 be stored each in a memory location corresponding to a respective address. Access logic 310 may include some or all of the features of access logic 120 and/or access logic 210a, for example.

Servicing write requests 305 may include access logic 310 sending data DA 330 and DB 332 to encoder logic 320 of device 300. Encoder logic 320 may include some or all of the features of error correction logic 130—e.g. where encoder logic 320 further provides some or all of the functionality of error detection logic 220a (and/or of error detection logic 220b). In an embodiment, encoder logic 320 receives MD 334 and/or other information based on access logic 310 receiving one or more write requests 305, where encoder logic 320 identifies that MD 334 describes a characteristic—e.g. including a data characteristic, a processing characteristic, a use characteristic and/or the like—which is common to both DA 330 and DB 332. For example, encoder logic 320 may receive MD 334 and/or such other information from access logic 310, although certain embodiments are not limited in this regard. In an embodiment, MD 334 is provided to device 300 in one or more write requests 305.

Encoder logic 320 may include some or all of the features of error correction logic 130, for example. In an embodiment, MD 334 and DA 330 may be provided as inputs to process circuitry 340 of encoder logic 320, where a result RA 350 output from process circuitry 340 is a value based on both MD 334 and DA 330. By way of illustration and not limitation RA 350 may be an encoding of MD 334 and DA 330. Such encoding may include one or more arithmetic operations—e.g. including a concatenation operation, an addition operation, a shift operation and/or the like—for which MD 334 and DA 330 are operands. Alternatively or in addition, MD 334 and DB 332 may be provided as inputs to process circuitry 345 of encoder logic 320, where a result RB 355 output from process circuitry 345 is a value based on both MD 334 and DB 332. Calculations for process circuitry 345 to generate RB 355 may be similar to those of process circuitry 340 to generate RA 350, for example. In an embodiment, process circuitry 340, 345 are the same circuitry.

With the calculated results RA 350, RB 355, encoder logic 320 may generate error correction codes PA 370, PB 375 for storing to one or more memory devices. By way of illustration and not limitation, process circuitry 360 of encoder logic 320 may calculate PA 370—e.g. a LDPC code, Hamming code, a Reed-Solomon code, a BCH code or other such error correction code value for RA 350. Alternatively or in addition, process circuitry 365 of encoder logic 320 may calculate as value PB 375 another LDPC code, Hamming code, a Reed-Solomon code, a BCH code or other such error correction code value for RB 355. Process circuitry 360, 365 may be the same circuitry, although certain embodiments are not limited in this regard.

In an embodiment, encoder logic 320 provides the calculated PA 370, PB 375 to facilitate access logic 310 generating write commands 380. By way of illustration and not limitation, servicing of one or more write requests 305 may include access logic 310 sending write commands 380 to one or more memory devices to store DA 330, DB 332, PA 370, PB 375 each to a respective addressable location of the one or more memory devices. In an embodiment, one version of MD 334 is also written to a respective location of the one or more memory devices, where the one version is available for future access to perform later error detection when DA 330 and/or DB 332 is later read from the one or more memory devices. In an embodiment, device 300 includes reference information (not shown) identifying that the location of the single stored version of MD 334 is associated with both the location in memory where DA 330 is stored and the location in memory where DB 332 is stored. Such reference information may be subsequently accessed in response to a read of DA 330 and/or of DB 332 from memory to identify that MD 334 is to be retrieved for use in error detection operations. Storing the single version of MD 334 to support error correction for multiple data blocks allows for efficient use of memory resources.

Figure 4:
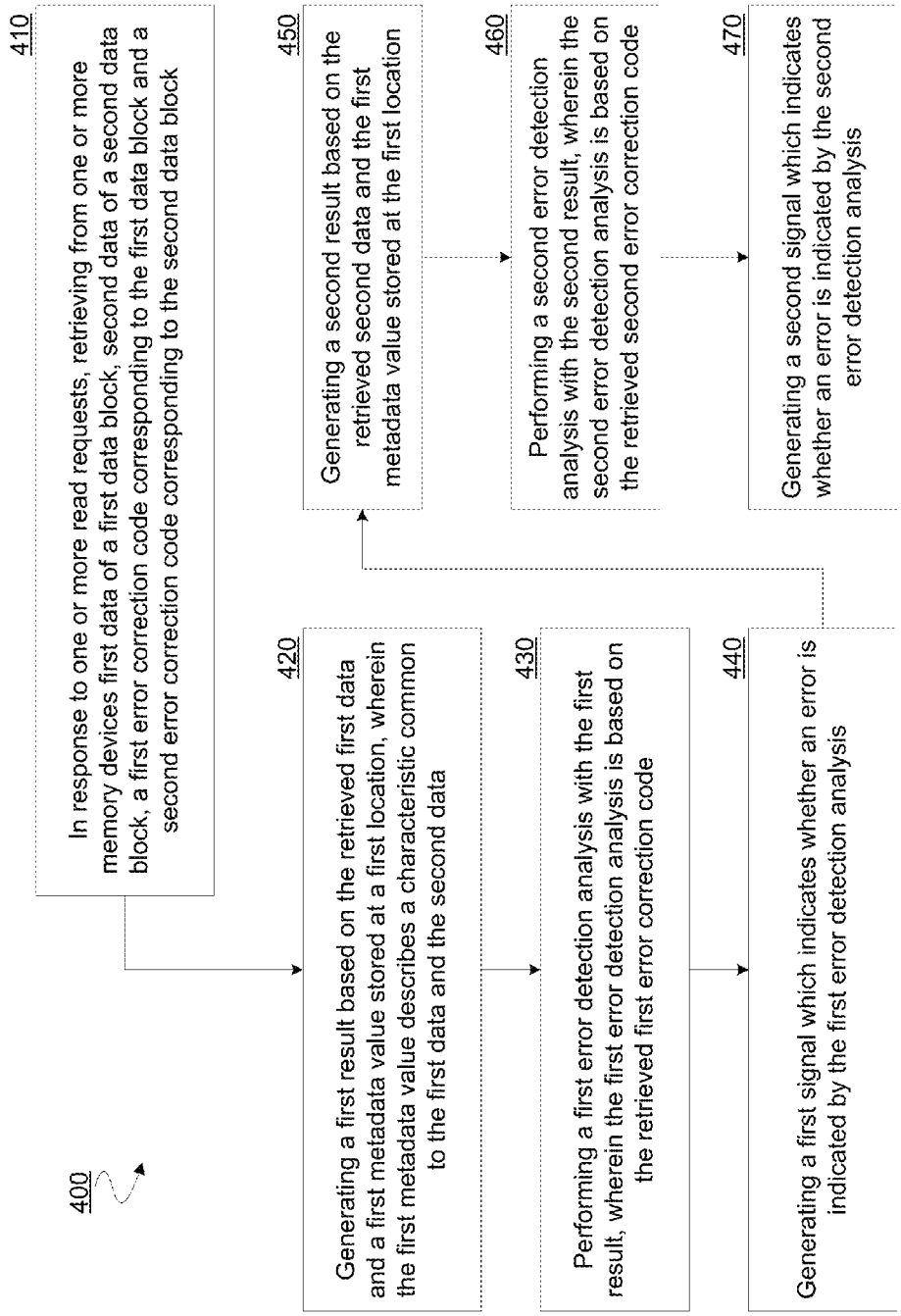
FIG. 4 is a flow diagram illustrating elements of a method for calculating error correction information according to an embodiment.

FIG. 4 illustrates elements of a method 400 for evaluating error correction information according to an embodiment. Method 400 may be performed by a controller device having some or all of the features of memory controller 110, for example. In an embodiment, method 400 is performed by circuitry having some or all of the functionality of device 200a (and/or of device 200b).

At 410, method 400 may include, in response to one or more read requests, retrieving from one or more memory devices first data of a first data block, second data of a second data block, a first error correction code corresponding to the first data block, and a second error correction code corresponding to the second data block. In an embodiment, logic of the memory controller—e.g. access logic 210a—may further access reference information in response to the one or more read requests and to identify, based on the reference information, respective associations of the first data block and the second data block each with the first location. For example, the memory controller may include or otherwise have access to a table mapping the first location to each of a plurality of addresses. Such reference information may specify or otherwise indicate that metadata stored at the first location is to be retrieved to support error correction for a data block in any of a plurality of memory locations—e.g. including the respective memory locations where the first data block and the second data block are stored. The reference information may have been generated, for example, in response to a previous one or more requests to write the first data block and/or the second data block to the one or more memory devices.

At 420, method 400 may include generating a first result based on the retrieved first data and a first metadata value stored at a first location, wherein the first metadata value describes a characteristic common to the first data and the second data. By way of illustration and not limitation, the generating of the first result at 420 may include calculating one or more of a concatenation of the first data and the first metadata value, a summation of the first data and the first metadata value, a product of the first data and the first metadata value, or any of a variety of other functions for which the respective values of the first data and the first metadata are each an operand. Alternatively or in addition, generating the first result may include generating a codeword based on the first data, the first error correction code and the first metadata value.

With the first result, method 400 may further include, at 430, performing a first error detection analysis with the first result generated at 420, wherein the first error detection analysis is based on the retrieved first error correction code. For example, the first result may be calculated as a function for which the first data and the first metadata value are operands, the first error detection analysis includes comparing an error correction code calculated for the first result with the first error correction code to determine whether the two values are equal or unequal. If such a first error detection analysis indicates that the error correction codes are not equal to one another, a data error of the first data may be indicated. In an embodiment, method 400 further includes, at 440, generating a first signal which indicates whether an error is indicated by the first error detection analysis.

Alternatively or in addition, the first result may be a codeword based on the retrieved first data, the retrieved first error correction code and the first metadata value, where the first error detection analysis performed at 430 includes calculating a syndrome value based on the first result, and comparing the syndrome value to a reference value (e.g. zero). A result of such comparison may additionally or alternatively be indicated with the first signal generated at 440.

At 450, method 400 may include generating a second result based on the second data retrieved at 410 and the first metadata value stored at the first location. The generating of the second result at 450 may include, for example, any of the techniques discussed herein for generating the first result at 420. With the second result, method 400 may further include, at 460, performing a second error detection analysis with the second result, wherein the second error detection analysis is based on the second error correction code retrieved at 410. For example, the second error detection analysis may include comparing an error correction code calculated for the second result with the second error correction code to determine whether the two error correction codes are equal or unequal. If the second error detection analysis indicates that the error correction codes are not equal to one another, a data error of the second data may be indicated. Alternatively, second error detection analysis may include calculating a syndrome value for the second result, and comparing the syndrome value to a zero (0) or some other reference value to detect for an error in data, metadata and/or an error correction code. In an embodiment, method 400 further includes, at 470, generating a second signal which indicates whether an error is indicated by the second error detection analysis.

Figure 5:
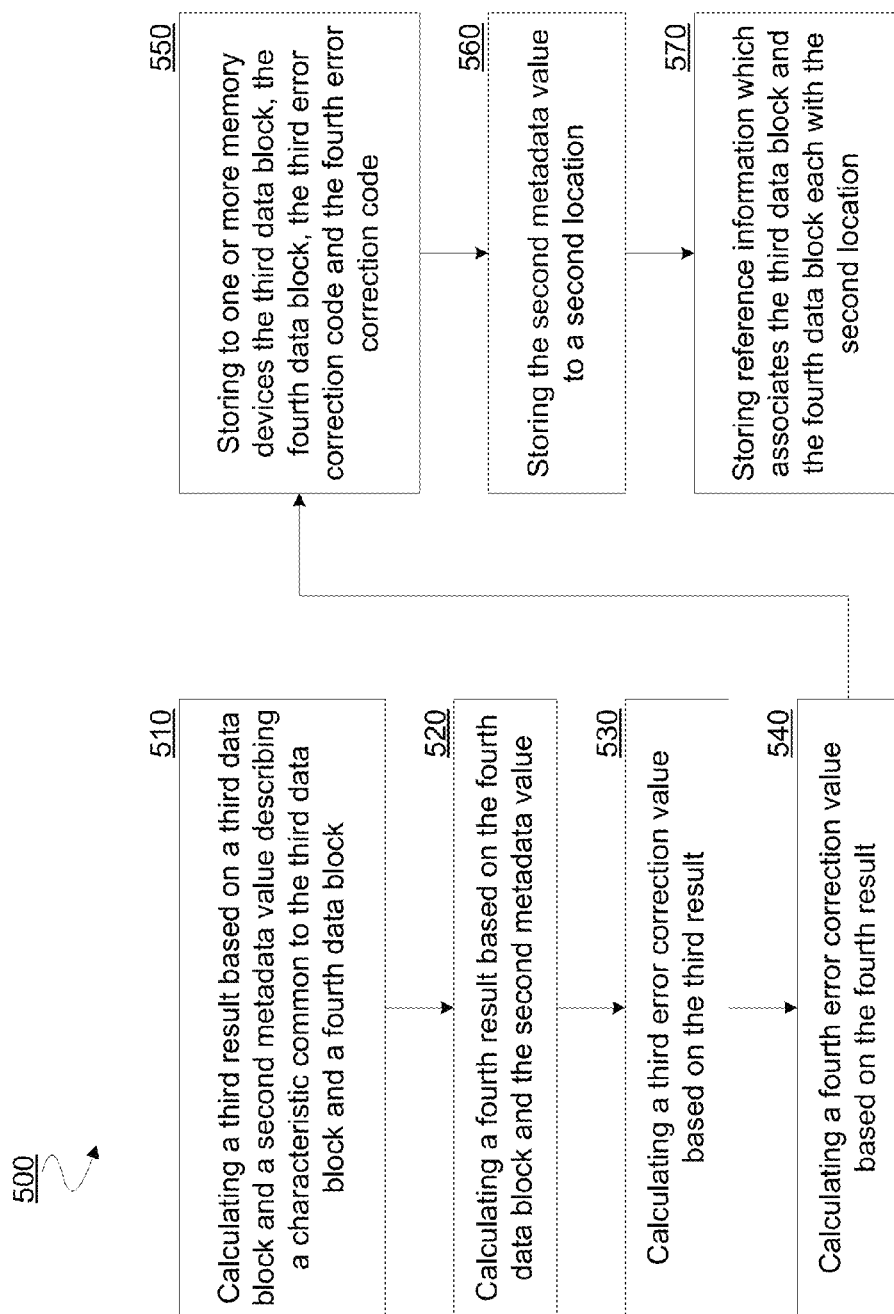
FIG. 5 is a flow diagram illustrating elements of a method for calculating error correction information according to an embodiment.

FIG. 5 illustrates elements of a method for generating error correction information according to an embodiment. Method 500 may be performed, for example, by circuit logic which provides some or all of the features of error correction logic 130. Such logic may, for example, have some of all of the functionality of access logic 310 and/or encoder logic 320. Method 500 may be performed by a device which also performs method 300, although certain embodiments are not limited in this regard.

In an embodiment, method 500 is performed in response to one or more write requests received by a memory controller. Method 500 may include, at 510, calculating a third result based on a third data block and a second metadata value describing a characteristic common to the third data block and a fourth data block. By way of illustration and not limitation, the third data block, fourth data block and second metadata value may be, respectively, the first data block, second data block and first metadata value in method 400. The third data block and fourth data block—and, an embodiment, the second metadata value—may be provided to the memory controller in the one or more write requests.

By way of illustration and not limitation, the generating of the third result at 510 may include calculating one or more of a concatenation of the third data block and the second metadata value, a summation of the third data block and the second metadata value, a product of the third data block and the second metadata value, or any of a variety of other functions for which the respective values of the third data block and the second metadata are each an operand.

At 520, method 500 may include calculating a fourth result based on the fourth data block and the second metadata value. The generating of the fourth result at 520 may include, for example, any of the techniques discussed herein for generating the third result at 510. Method 500 may further include, at 530, calculating a third error correction code based on the third result. For example, the calculating at 530 may include calculating a LDPC code of the third result, a Hamming code, a Reed-Solomon code, a BCH code and/or any of a variety of additional or alternative error correction codes for the third result. In an embodiment, method 500 further includes, at 540, calculating a fourth error correction code based on the fourth result—e.g. according to any of the techniques discussed herein for generating the third error correction code at 530. At 550, method 500 may include storing to one or more memory devices the third data block, the fourth data block, the third error correction code and the fourth error correction code.

Method 500 may further include, at 560, storing the second metadata value to a second location—e.g. a location of the one or more memory devices. For example, the memory controller may identify that a particular characteristic is common to the third data block and the fourth data block. In an embodiment, the memory controller identifies that an association of a host process, file identifier, job identifier, access statistic, cryptographic key, access privilege or other information with the third data block is the same as an association of that information with the fourth data block. Based on such identifying, method 500 may include determining that a single version of the second metadata value, which represents the characteristic, is to be made available for later access to facilitate error detection for both of the third data block and the fourth data block. In an embodiment, method 500 further includes, at 570, storing reference information which associates the third data block and the fourth data block each with the second location. Such reference information may specify or otherwise indicate to the memory controller—e.g. in response to one or more subsequent read requests—that information is to be retrieved from the second location to facilitate error detection (and, in an embodiment, error correction) for any or both of the third data block and the fourth data block.

Figure 6:
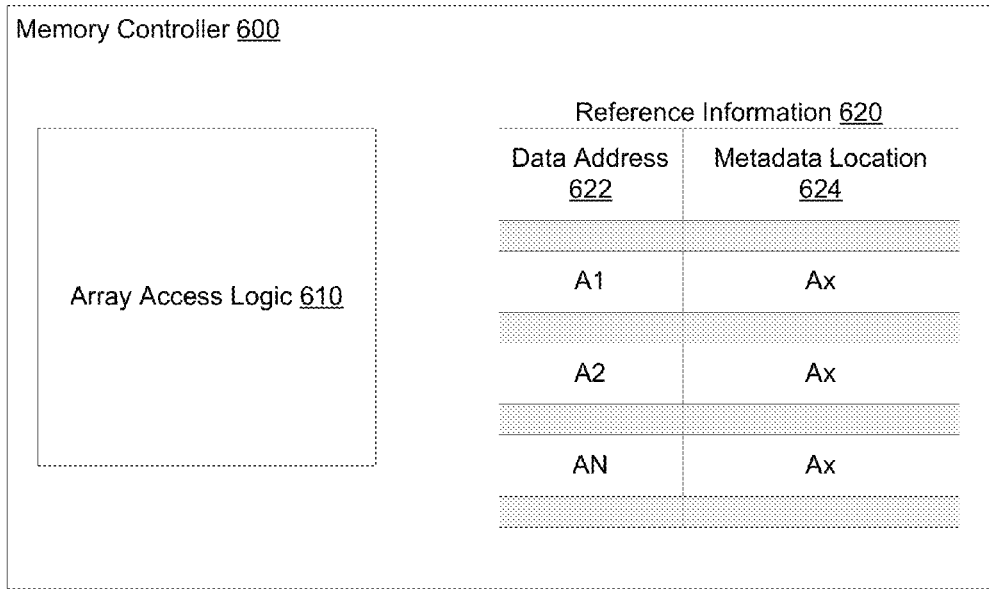
FIG. 6 is a block diagram illustrating elements of a memory device for storing an error correction code according to an embodiment.

FIG. 6 illustrates elements of a memory controller 600 for providing access to error correction information according to an embodiment. Memory controller 600 may operate in a system including some or all of the features of computer system 100, for example. In an embodiment, access to memory controller 600 controls a memory device having some or all of the features of memory device 150. For example, memory controller 600 may perform method 400 and/or method 500 for providing access to such a memory device.

In an embodiment, memory controller 600 includes reference information 620 comprising a table mapping data addresses 622 each with respective metadata locations 624. Memory device logic 600 may further include array access logic 610 including circuitry to selectively access various locations of one or more memory devices—e.g. to retrieve one or more data blocks which are the subject of one or more read requests serviced by the memory controller.

In an embodiment, functionality of array access logic 610 maps addresses 622 which are each specific to a different respective memory location. At a given time during operation of memory controller 600, some or all memory locations which correspond to a respective one of addresses 622 may each store a respective data block and, in an embodiment, a corresponding error correction code. Alternatively, some or all such error correction codes may be stored in memory locations which are different from those storing their corresponding data blocks.

By way of illustration and not limitation, at some point in time, memory locations specified by addresses A1, A2, and AN, respectively, may each store a different data block. At some previous point in time, array access logic 610 may have identified that a metadata value represents a characteristic which is common to—i.e. descriptive of—each of these different data blocks. In response to such identification, array access logic 610 may determine that a single version of the metadata value is stored in (or is to be stored in) a memory location specified by an address Ax. The single version of the metadata value may be stored in a memory location with one of the data blocks, although certain embodiments are not limited in this regard. For example, Ax may be one of addresses A1, A2, AN, in an embodiment. Array access logic 610 may store the value Ax in the metadata locations 624 field for the respective table entries corresponding to addresses A1, A2, AN. Based on such storing of reference information 620, array access logic 610 may retrieve the same version of the metadata value to perform error detection for any of the data blocks stored at addresses A1, A2, AN.

It will be appreciated that data blocks, respective error correction codes and a corresponding metadata value may each be variously stored at different respective addressable memory locations. For example, 1 KB of data may be stored in an address range that starts at a particular address, where an associated error correction code is stored in a memory location having an address at the end—e.g. after—that address range.

Figure 7:
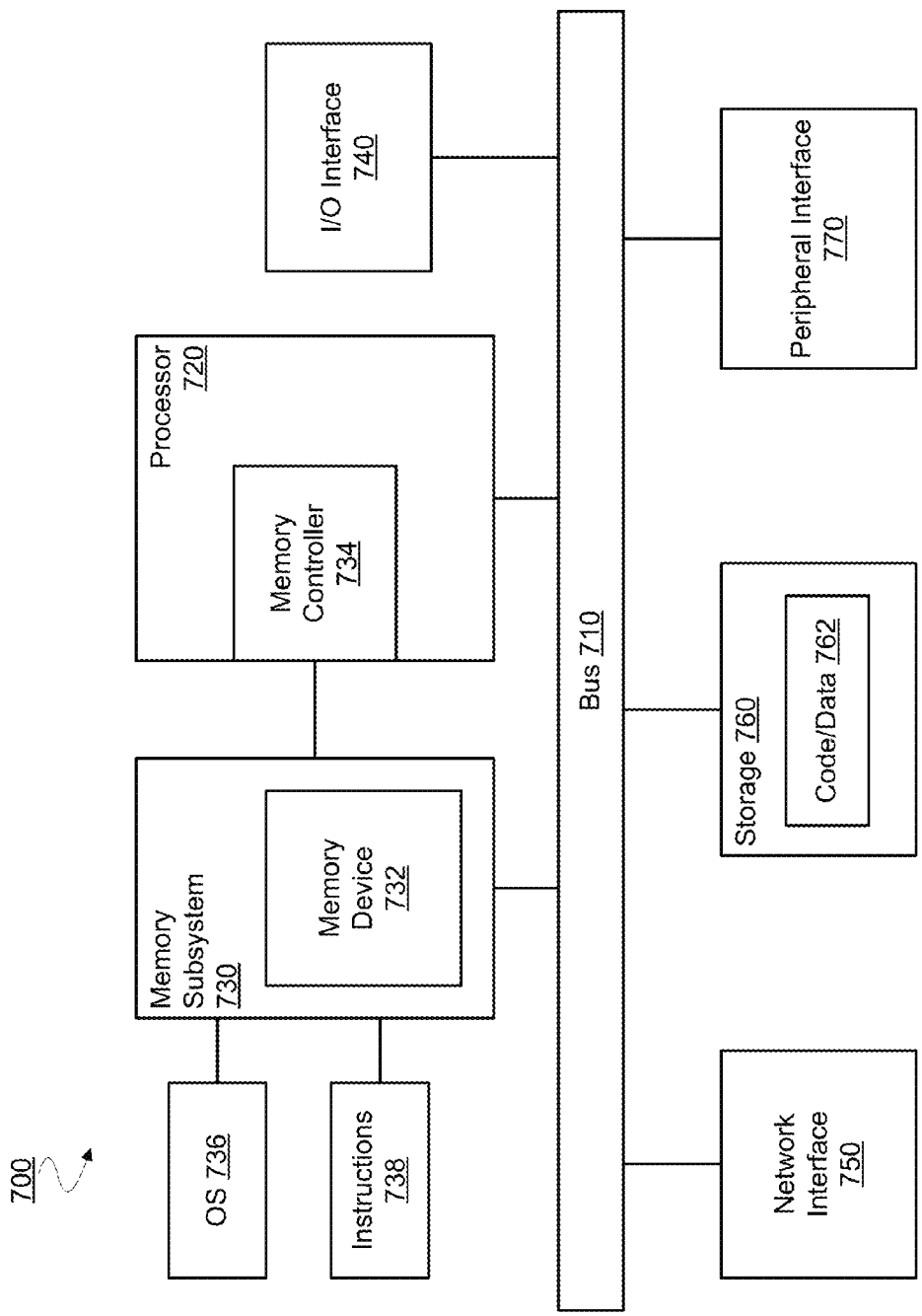
FIG. 7 is a block diagram illustrating elements of a computer platform for providing error correction according to an embodiment.

FIG. 7 is a block diagram of an embodiment of a computing system in which data error correction/detection can be implemented. System 700 represents a computing device in accordance with any embodiment described herein, and can be a laptop computer, a desktop computer, a server, a gaming or entertainment control system, a scanner, copier, printer, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 includes memory device 732 where it stores data, instructions, programs, or other items. In one embodiment, processor 720 includes memory controller 734, which includes memory controller logic in accordance with any embodiment described herein—e.g. which provides for error detection and, in an embodiment, error correction. Memory controller 734 may service a write request from a core of processor 720, including sending for storage in a location of memory device 732 data and an error correction code for a value calculated based on data of a data block and a metadata value describing a characteristic for that data block. Memory controller 734 may additionally or alternatively service a read request from a processor core—e.g. including retrieving and evaluating data and an error correction code previously stored by such servicing of a write command. Memory controller 734 may alternatively be a component of memory subsystem 730, although certain embodiments are not limited in this regard.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a Universal Serial Bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700). Address verification and error correction/detection mechanisms and techniques may, according to different embodiments, be applied for protecting accesses to memory subsystem 730 and/or storage 760, for example.

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

Figure 8:
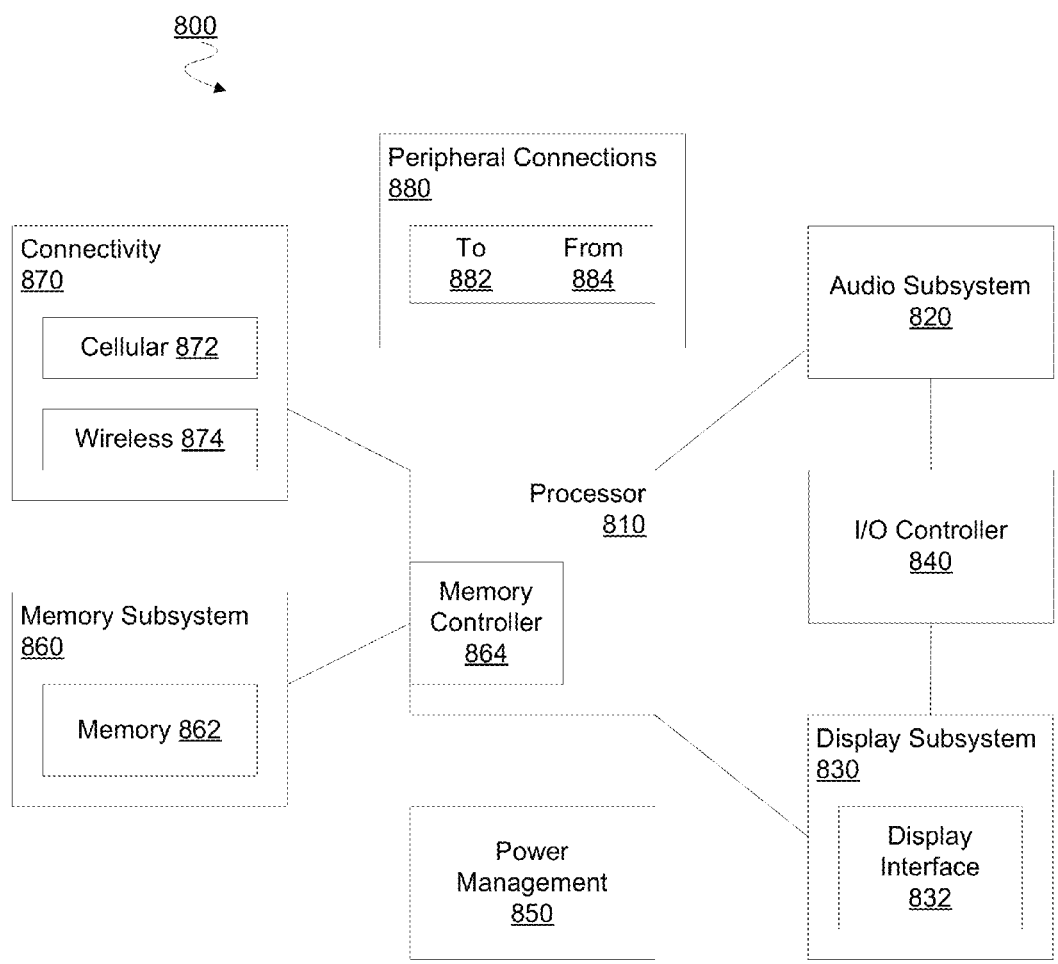
FIG. 8 is a block diagram illustrating elements of a mobile device for providing error correction according to an embodiment.

FIG. 8 is a block diagram of an embodiment of a mobile device in which error detection/correction can be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of device 800.

In one embodiment, processor 810 includes memory controller 864 (which could also be considered part of the control of device 800, and could alternatively be part of memory subsystem 860). Memory controller 864 may provide for error detection and, in an embodiment, error correction. Such error detection and/or correction may be based, for example, on evaluation of an error correction code for a value calculated based on data of a data block and a metadata value describing a characteristic for that data block.

Connectivity 870 includes hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a memory controller comprises memory access logic to service one or more read requests, including the memory access logic to retrieve from one or more memory devices first data of a first data block, second data of a second data block, a first error correction code corresponding to the first data block and a second error correction code corresponding to the second data block. The memory controller further comprises error detection logic to generate a first result based on the retrieved first data and a first metadata value stored at a first location, wherein the first metadata value describes a characteristic common to the first data and the second data, and to perform a first error detection analysis with the first result, wherein the first error detection analysis is based on the retrieved first error correction code, and to generate a first signal which indicates whether an error is indicated by the first error detection analysis. The error detection logic is further to generate a second result based on the retrieved second data and the first metadata value stored at the first location, to perform a second error detection analysis with the second result, wherein the second error detection analysis is based on the retrieved second error correction code, and to generate a second signal which indicates whether an error is indicated by the second error detection analysis.

In an embodiment, the error detection logic to perform the first error detection analysis includes the error detection logic to calculate an error correction code for the first result and to compare the error correction code for the first result to the first error correction code. In another embodiment, the first result is a codeword including the first data, the first error correction code and the first metadata value, wherein the error detection logic to perform the first error detection analysis includes the error detection logic to calculate a syndrome for the codeword. In another embodiment, the memory access logic is further to access reference information in response to the one or more read requests and to identify based on the reference information an association of the first data block and the second data block each with the first location. In another embodiment, the first error correction code includes one of a Reed-Solomon value, a Hamming value, a Bose, Ray-Chaudhuri, Hocquenghem value and a low-density parity-check value for the first result.

In another embodiment, the memory access logic is further to service one or more write requests, including the memory access logic to store to the one or more memory devices a third data block, a fourth data block, a third error correction code, and a fourth error correction code, to store a second metadata value to a second location, wherein the second metadata value describes a characteristic common to the third data block and the fourth data block, and to store reference information which associates the third data block and the fourth data block each with the second location. The memory controller comprises encoder logic, responsive to the one or more write requests, to calculate a third result based on the third data block and the second metadata value, to calculate a fourth result based on the fourth data block and the second metadata value, to calculate the third error correction code based on the third result, and to calculate the fourth error correction code based on the fourth result.

In another embodiment, the memory access logic is further to detect, in response to the one or more write requests, that the characteristic is common to the third data block and the fourth data block. In another embodiment, the memory access logic is to store reference information in response to detection by the memory access logic that the characteristic is common to the third data block and the fourth data block.

In one aspect, a method at a memory controller comprises, in response to one or more read requests, retrieving from one or more memory devices first data of a first data block, second data of a second data block, a first error correction code corresponding to the first data block, and a second error correction code corresponding to the second data block. The method further comprises generating a first result based on the retrieved first data and a first metadata value stored at a first location, wherein the first metadata value describes a characteristic common to the first data and the second data, performing a first error detection analysis with the first result, wherein the first error detection analysis is based on the retrieved first error correction code, and generating a first signal which indicates whether an error is indicated by the first error detection analysis. The method further comprises generating a second result based on the retrieved second data and the first metadata value stored at the first location, performing a second error detection analysis with the second result, wherein the second error detection analysis is based on the retrieved second error correction code, and generating a second signal which indicates whether an error is indicated by the second error detection analysis.

In an embodiment, the method further comprises accessing reference information in response to the one or more read requests, and identifying based on the reference information an association of the first data block and the second data block each with the first location. In another embodiment, the first error correction code includes one of a Reed-Solomon value, a Hamming value, a Bose, Ray-Chaudhuri, Hocquenghem value and a low-density parity-check value for the first result. In another embodiment, generating the first result includes calculating one of a concatenation of the first data and the first metadata value, a summation of the first data and the first metadata value, or a product of the first data and the first metadata value. In another embodiment, the first metadata value includes one of an access statistic, a timestamp, a cryptographic key, or a file identifier.

In another embodiment, the method further comprises, in response to one or more write requests, calculating a third result based on a third data block and a second metadata value describing a characteristic common to the third data block and a fourth data block, calculating a fourth result based on the fourth data block and the second metadata value, calculating a third error correction code based on the third result and calculating a fourth error correction code based on the fourth result. The method further comprises storing to one or more memory devices the third data block, the fourth data block, the third error correction code and the fourth error correction code, storing the second metadata value to a second location, and storing reference information which associates the third data block and the fourth data block each with the second location.

In another embodiment, the method further comprises detecting, in response to the one or more write requests, that the characteristic is common to the third data block and the fourth data block. In another embodiment, the storing the reference information in response to the detecting that the characteristic is common to the third data block and the fourth data block.

In one aspect, a system comprises one or more memory devices and a memory controller to control the one or more memory devices. The memory controller includes memory access logic to service one or more read requests, including the memory access logic to retrieve from one or more memory devices first data of a first data block, second data of a second data block, a first error correction code corresponding to the first data block and a second error correction code corresponding to the second data block. The memory controller further includes error detection logic to generate a first result based on the retrieved first data and a first metadata value stored at a first location, wherein the first metadata value describes a characteristic common to the first data and the second data, to perform a first error detection analysis with the first result, wherein the first error detection analysis is based on the retrieved first error correction code, to generate a first signal which indicates whether an error is indicated by the first error detection analysis. The error detection logic is further to generate a second result based on the retrieved second data and the first metadata value stored at the first location, to perform a second error detection analysis with the second result, wherein the second error detection analysis is based on the retrieved second error correction code, and to generate a second signal which indicates whether an error is indicated by the second error detection analysis. The system further comprises a touchscreen display device configured to provide a user display based on data accessed by the memory controller.

In an embodiment, the error detection logic to perform the first error detection analysis includes the error detection logic to calculate an error correction code for the first result and to compare the error correction code for the first result to the first error correction code. In another embodiment, the first result is a codeword including the first data, the first error correction code and the first metadata value, wherein the error detection logic to perform the first error detection analysis includes the error detection logic to calculate a syndrome for the codeword. In another embodiment, the memory access logic is further to access reference information in response to the one or more read requests and to identify based on the reference information an association of the first data block and the second data block each with the first location. In another embodiment, the first error correction code includes one of a Reed-Solomon value, a Hamming value, a Bose, Ray-Chaudhuri, Hocquenghem value and a low-density parity-check value for the first result.

In another embodiment, the memory access logic is further to service one or more write requests, including the memory access logic to store to the one or more memory devices a third data block, a fourth data block, a third error correction code, and a fourth error correction code, to store a second metadata value to a second location, wherein the second metadata value describes a characteristic common to the third data block and the fourth data block, and to store reference information which associates the third data block and the fourth data block each with the second location. The memory controller comprises encoder logic, responsive to the one or more write requests, to calculate a third result based on the third data block and the second metadata value, to calculate a fourth result based on the fourth data block and the second metadata value, to calculate the third error correction code based on the third result, and to calculate the fourth error correction code based on the fourth result.

In another embodiment, the memory access logic is further to detect, in response to the one or more write requests, that the characteristic is common to the third data block and the fourth data block. In another embodiment, the memory access logic is to store reference information in response to detection by the memory access logic that the characteristic is common to the third data block and the fourth data block.

In one aspect, a computer-readable storage medium has stored thereon instructions which, when executed by one or more processing units, cause the one or more processing units to perform a method. The method comprises, in response to one or more read requests, retrieving from one or more memory devices first data of a first data block, second data of a second data block, a first error correction code corresponding to the first data block, and a second error correction code corresponding to the second data block. The method further comprises generating a first result based on the retrieved first data and a first metadata value stored at a first location, wherein the first metadata value describes a characteristic common to the first data and the second data, performing a first error detection analysis with the first result, wherein the first error detection analysis is based on the retrieved first error correction code, and generating a first signal which indicates whether an error is indicated by the first error detection analysis.

The method further comprises generating a second result based on the retrieved second data and the first metadata value stored at the first location, performing a second error detection analysis with the second result, wherein the second error detection analysis is based on the retrieved second error correction code, and generating a second signal which indicates whether an error is indicated by the second error detection analysis.

In an embodiment, the method further comprises accessing reference information in response to the one or more read requests, and identifying based on the reference information an association of the first data block and the second data block each with the first location. In another embodiment, the first error correction code includes one of a Reed-Solomon value, a Hamming value, a Bose, Ray-Chaudhuri, Hocquenghem value and a low-density parity-check value for the first result. In another embodiment, the first metadata value includes one of an access statistic, a timestamp, a cryptographic key, or a file identifier.

In another embodiment, the method further comprises, in response to one or more write requests, calculating a third result based on a third data block and a second metadata value describing a characteristic common to the third data block and a fourth data block, calculating a fourth result based on the fourth data block and the second metadata value, calculating a third error correction code based on the third result, and calculating a fourth error correction code based on the fourth result. The method further comprises storing to one or more memory devices the third data block, the fourth data block, the third error correction code and the fourth error correction code, storing the second metadata value to a second location, and storing reference information which associates the third data block and the fourth data block each with the second location. In another embodiment, the method further comprises detecting, in response to the one or more write requests, that the characteristic is common to the third data block and the fourth data block.

Techniques and architectures for providing error correction information are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory controller comprising:
    memory access logic to service one or more write requests, including the memory access logic to:
        store to one or more memory devices a first data block, a second data block, a first error correction code corresponding to the first data block, and a second error correction code corresponding to the second data block;
        identify a first metadata value as corresponding to both the first data block and the second data block, wherein the first metadata value describes a characteristic that, prior to the one or more write requests, is common to the first data block and the second data block; and
        store reference information in response to identification of the first metadata value, wherein the reference information associates the first data block and the second data block each with a first location storing the first metadata value;
    wherein the memory controller comprises encoder logic, responsive to the one or more write requests, to:
        calculate a first result based on the first data block and the first metadata value;
        calculate a second result based on the second data block and the first metadata value;
        calculate the first error correction code based on the first result; and
        calculate the second error correction code based on the second result;
    the memory access logic further to service one or more read requests, including the memory access logic to retrieve from the one or more memory devices first data of the first data block, second data of the second data block, the first error correction code and the second error correction code; and
    wherein, responsive to the one or more read requests, the error detection logic further to generate a third result based on the retrieved first data and the first metadata value stored at the first location to perform a first error detection analysis with the third result, wherein the first error detection analysis is based on the retrieved first error correction code, to generate a first signal which indicates whether an error is indicated by the first error detection analysis, to generate a fourth result based on the retrieved second data and the first metadata value stored at the first location, to perform a second error detection analysis with the fourth result, wherein the second error detection analysis is based on the retrieved second error correction code, and to generate a second signal which indicates whether an error is indicated by the second error detection analysis.

2. The memory controller of claim 1, wherein the error detection logic to perform the first error detection analysis includes the error detection logic to calculate an error correction code for the first result and to compare the error correction code for the first result to the first error correction code.

3. The memory controller of claim 1, wherein the first result is a codeword including the first data, the first error correction code and the first metadata value, wherein the error detection logic to perform the first error detection analysis includes the error detection logic to calculate a syndrome for the codeword.

4. The memory controller of claim 1, wherein the memory access logic further to access reference information in response to the one or more read requests and to identify based on the reference information an association of the first data block and the second data block each with the first location.

5. The memory controller of claim 1, wherein the first error correction code includes one of a Reed-Solomon value, a Hamming value, a Bose, Ray-Chaudhuri, Hocquenghem value and a low-density parity-check value for the first result.

6. The memory controller of claim 1, wherein the one or more write requests include multiple write requests each including the first metadata value.

7. The memory controller of claim 1, wherein the memory access logic to store the first metadata value in response to the one or more write requests.

8. A method at a memory controller, the method comprising:
servicing one or more write requests, including:
identifying a first metadata value as corresponding to both a first data block and a second data block, wherein the first metadata value describes a characteristic that, prior to the one or more write requests, is common to the first data block and the second data block;
storing reference information in response to identification of the first metadata value, wherein the reference information associates the first data block and the second data block each with a first location storing the first metadata value;
calculating a first result based on the first data block and the first metadata value;
calculating a second result based on the second data block and the first metadata value;
calculating a first error correction code based on the first result;
calculating a second error correction code based on the second result;
storing to one or more memory devices the first data block, the second data block, the first error correction code, and the second error correction code;
in response to one or more read requests, retrieving from one or more memory devices first data of the first data block, second data of the second data block, the first error correction code, and the second error correction code;
generating a third result based on the retrieved first data and the first metadata value stored at the first location;
performing a first error detection analysis with the third result, wherein the first error detection analysis is based on the retrieved first error correction code;
generating a first signal which indicates whether an error is indicated by the first error detection analysis;
generating a fourth result based on the retrieved second data and the first metadata value stored at the first location;
performing a second error detection analysis with the fourth result, wherein the second error detection analysis is based on the retrieved second error correction code; and
generating a second signal which indicates whether an error is indicated by the second error detection analysis.

9. The method of claim 8, further comprising:
accessing reference information in response to the one or more read requests; and
identifying based on the reference information an association of the first data block and the second data block each with the first location.

10. The method of claim 8, wherein the first error correction code includes one of a Reed-Solomon value, a Hamming value, a Bose, Ray-Chaudhuri, Hocquenghem value and a low-density parity-check value for the first result.

11. The method of claim 8, wherein generating the first result includes calculating one of:
a concatenation of the first data and the first metadata value;
a summation of the first data and the first metadata value; or
a product of the first data and the first metadata value.

12. The method of claim 8, wherein the first metadata value includes one of an access statistic, a timestamp, or a file identifier.

13. The method of claim 8, further comprising storing the first metadata value in response to the one or more write requests.

14. The method of claim 13, wherein the one or more write requests include multiple write requests each including the first metadata value.

15. A system comprising:
one or more memory devices;
a memory controller to control the one or more memory devices, the memory controller including:
memory access logic to service one or more write requests, including the memory access logic to:
store to the one or more memory devices a first data block, a second data block, a first error correction code corresponding to the first data block, and a second error correction code corresponding to the second data block;
identify a first metadata value as corresponding to both the first data block and the second data block, wherein the first metadata value describes a characteristic that, prior to the one or more write requests, is common to the first data block and the second data block; and
store reference information in response to identification of the first metadata value, wherein the reference information associates the first data block and the second data block each with a first location storing the first metadata value;
wherein the memory controller comprises encoder logic, responsive to the one or more write requests, to:
calculate a first result based on the first data block and the first metadata value;
calculate a second result based on the second data block and the first metadata value;
calculate the first error correction code based on the first result; and
calculate the second error correction code based on the second result;
the memory access logic further to service one or more read requests, including the memory access logic to retrieve from the one or more memory devices first data of the first data block, second data of the second data block, the first error correction code and the second error correction code; and
wherein, responsive to the one or more read requests, the error detection logic further to generate a third result based on the retrieved first data and the first metadata value stored at the first location to perform a first error detection analysis with the third result, wherein the first error detection analysis is based on the retrieved first error correction code, to generate a first signal which indicates whether an error is indicated by the first error detection analysis, to generate a fourth result based on the retrieved second data and the first metadata value stored at the first location, to perform a second error detection analysis with the fourth result, wherein the second error detection analysis is based on the retrieved second error correction code, and to generate a second signal which indicates whether an error is indicated by the second error detection analysis; and
a touchscreen display device configured to provide a user display based on data accessed by the memory controller.

16. The system of claim 15, wherein the error detection logic to perform the first error detection analysis includes the error detection logic to calculate an error correction code for the first result and to compare the error correction code for the first result to the first error correction code.

17. A non-transitory computer-readable storage medium having stored thereon instructions which, when executed by one or more processing units, cause the one or more processing units to perform a method comprising:
  servicing one or more write requests, including:
    identifying a first metadata value as corresponding to both a first data block and a second data block, wherein the first metadata value describes a characteristic that, prior to the one or more write requests, is common to the first data block and the second data block;
    storing reference information in response to identification of the first metadata value, wherein the reference information associates the first data block and the second data block each with a first location storing the first metadata value;
    calculating a first result based on the first data block and the first metadata value;
    calculating a second result based on the second data block and the first metadata value;
    calculating a first error correction code based on the first result;
    calculating a second error correction code based on the second result;
    storing to one or more memory devices the first data block, the second data block, the first error correction code, and the second error correction code;
  in response to one or more read requests, retrieving from one or more memory devices first data of the first data block, second data of the second data block, the first error correction code, and the second error correction code;
  generating a third result based on the retrieved first data and the first metadata value stored at the first location;
  performing a first error detection analysis with the third result, wherein the first error detection analysis is based on the retrieved first error correction code;
  generating a first signal which indicates whether an error is indicated by the first error detection analysis;
  generating a fourth result based on the retrieved second data and the first metadata value stored at the first location;
  performing a second error detection analysis with the fourth result, wherein the second error detection analysis is based on the retrieved second error correction code; and
  generating a second signal which indicates whether an error is indicated by the second error detection analysis.

18. The computer-readable storage medium of claim 17, wherein the one or more write requests include multiple write requests each including the first metadata value.

* * * * *